US009923066B2

United States Patent
Kueck et al.

(10) Patent No.: US 9,923,066 B2
(45) Date of Patent: Mar. 20, 2018

(54) WIDE BANDGAP SEMICONDUCTOR DEVICE

(71) Applicant: Infineon Technologies AG, Neubiberg (DE)

(72) Inventors: Daniel Kueck, Villach (AT); Thomas Aichinger, Villach (AT); Franz Hirler, Isen (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/221,122

(22) Filed: Jul. 27, 2016

(65) Prior Publication Data

US 2017/0040425 A1    Feb. 9, 2017

(30) Foreign Application Priority Data

Aug. 6, 2015  (DE) .................. 10 2015 215 024

(51) Int. Cl.
*H01L 29/40*  (2006.01)
*H01L 29/78*  (2006.01)
(Continued)

(52) U.S. Cl.
CPC ........ *H01L 29/408* (2013.01); *H01L 29/0619* (2013.01); *H01L 29/1095* (2013.01); *H01L 29/407* (2013.01); *H01L 29/42368* (2013.01); *H01L 29/7397* (2013.01); *H01L 29/7811* (2013.01); *H01L 29/7813* (2013.01); *H01L 29/1608* (2013.01); *H01L 29/2003* (2013.01)

(58) Field of Classification Search
CPC .............. H01L 29/408; H01L 29/0619; H01L 29/1095; H01L 29/42368; H01L 29/7397
See application file for complete search history.

(56) References Cited

U.S. PATENT DOCUMENTS 7,825,449 B2  11/2010  Suzuki et al.
9,293,558 B2   3/2016  Siemieniec et al.
(Continued)

FOREIGN PATENT DOCUMENTS

DE   10 2008 055 689 A1   5/2009
DE   10 2014 104 975 A1  10/2014
(Continued)

*Primary Examiner* — Nathan W Ha
(74) *Attorney, Agent, or Firm* — Volpe and Koenig, P.C.

(57) ABSTRACT

A semiconductor device includes a source zone electrically connected to a first load terminal, a contiguous zone isolating the source zone from a drift zone, and a trench extending into a semiconductor body along a vertical direction and including a first electrode electrically connected to a control terminal and an insulator in contact with the contiguous zone and which isolates the first electrode from the semiconductor body. The insulator has, at a trench bottom region, a first thickness along the vertical direction, and, at a trench top region, a second thickness along a lateral direction, the first thickness being greater than the second thickness by a factor of at least 1.5. The contiguous zone is arranged in contact with the insulator and extends further along the vertical direction than the trench, and the trench bottom region and the contiguous zone overlap along the lateral direction.

25 Claims, 5 Drawing Sheets

(51) Int. Cl.
  *H01L 29/739* (2006.01)
  *H01L 29/10* (2006.01)
  *H01L 29/423* (2006.01)
  *H01L 29/06* (2006.01)
  *H01L 29/16* (2006.01)
  *H01L 29/20* (2006.01)

(56) References Cited

U.S. PATENT DOCUMENTS

| | | | |
|---|---|---|---|
| 9,496,384 B2 | 11/2016 | Nakano | |
| 2006/0214197 A1* | 9/2006 | Nakamura | H01L 29/4236 257/288 |
| 2009/0114969 A1* | 5/2009 | Suzuki | H01L 29/0619 257/301 |
| 2009/0166720 A1* | 7/2009 | Zundel | H01L 29/402 257/328 |
| 2010/0078707 A1* | 4/2010 | Haeberlen | H01L 29/7805 257/328 |
| 2011/0303925 A1* | 12/2011 | Nishimura | H01L 21/26586 257/77 |
| 2012/0037955 A1* | 2/2012 | Hirler | H01L 21/26506 257/140 |
| 2012/0313139 A1* | 12/2012 | Matsuura | H01L 29/36 257/139 |
| 2014/0070852 A1* | 3/2014 | Saito | H03K 3/012 327/109 |
| 2014/0077293 A1* | 3/2014 | Kitagawa | H01L 29/7827 257/330 |
| 2014/0145209 A1 | 5/2014 | Kumagai | |
| 2014/0306284 A1 | 10/2014 | Mauder et al. | |
| 2015/0171198 A1* | 6/2015 | Song | H01L 29/7397 257/139 |
| 2015/0187877 A1* | 7/2015 | Park | H01L 29/407 257/139 |
| 2015/0200248 A1* | 7/2015 | Ono | H01L 29/407 257/330 |
| 2015/0380024 A1 | 12/2015 | Horii | |

FOREIGN PATENT DOCUMENTS

| | | |
|---|---|---|
| JP | 2009-302091 A | 12/2009 |
| JP | 2014107571 A | 6/2014 |
| JP | 2014 175 470 A | 9/2014 |
| WO | 2013/081089 A | 6/2013 |

\* cited by examiner

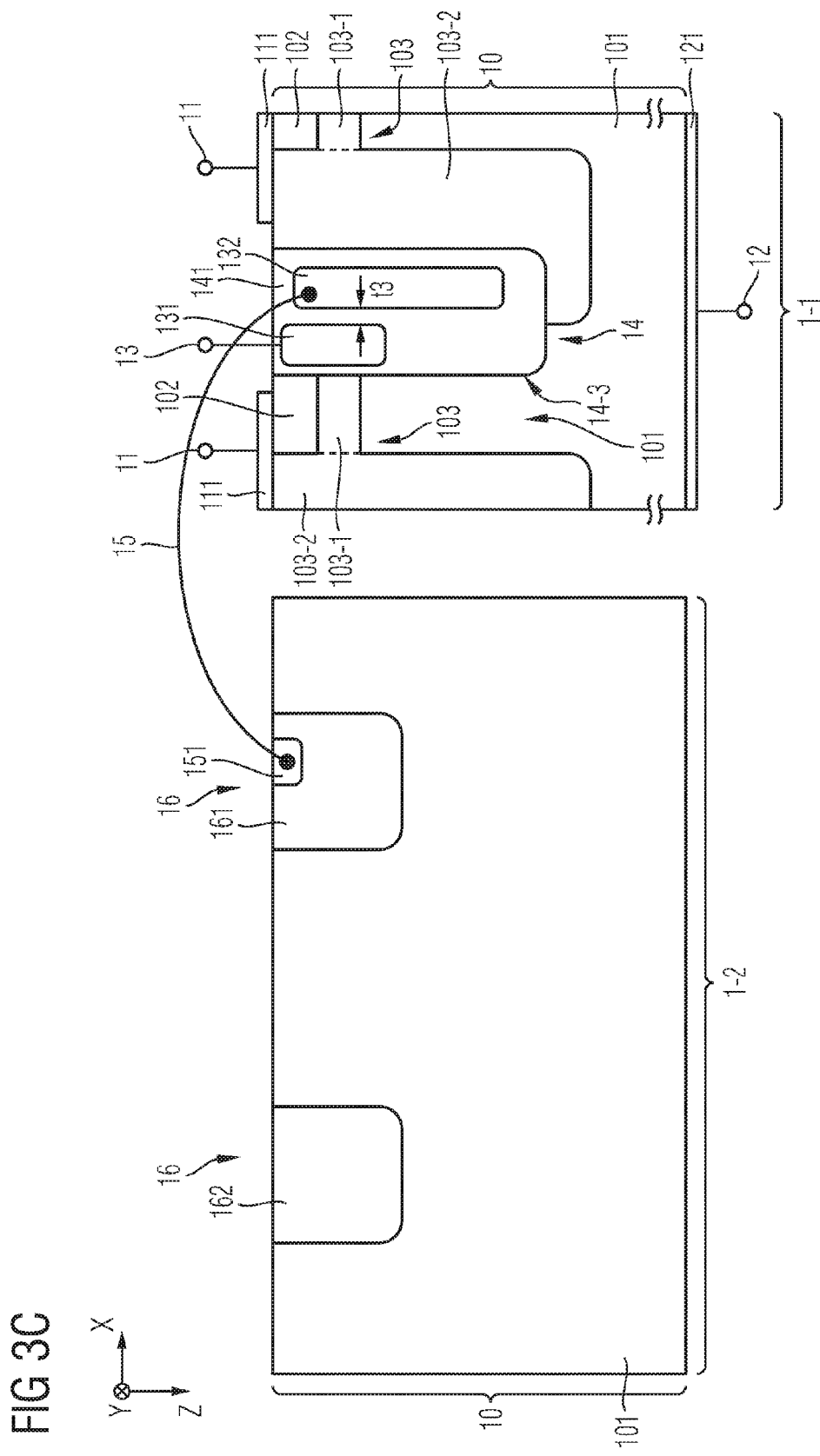

WIDE BANDGAP SEMICONDUCTOR DEVICE

FIELD

This specification refers to embodiments of a wide bandgap semiconductor device and to embodiments of a method of operating a wide band semiconductor device. In particular, this specification refers to embodiments of a wide bandgap semiconductor device that may exhibit a comparatively weak electric field within an oxide included in a trench, and to a method of operating a wide bandgap semiconductor device such that an electric field within an oxide included in a trench is comparatively weak.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to, switches in power supplies and power converters.

Occasionally, semiconductor devices are mainly based on a semiconductor material having a bandgap greater than the bandgap of silicon, such as silicon carbide or gallium nitride, to name a few. Such semiconductor devices are also referred to as "wide bandgap semiconductor devices". The wide bandgap semiconductor material may exhibit electrical properties significantly different from corresponding electrical properties of, e.g., silicon, which may result in certain provisions regarding the design of a wide bandgap semiconductor device, such as the design of a trench including a gate electrode.

SUMMARY

According to an embodiment, a further semiconductor device is presented. The further semiconductor devices includes a first load terminal, a second load terminal, a control terminal and a semiconductor body having a drift zone, wherein the semiconductor body is formed by a semiconductor material having a bandgap greater than the bandgap of silicon and is configured to conduct a load current between the first load terminal and the second load terminal. The semiconductor device includes a source zone arranged in the semiconductor body and electrically connected to the first load terminal; a contiguous zone arranged in the semiconductor body and isolating the source zone from the drift zone; a trench extending into the semiconductor body along a vertical direction and comprising a first electrode electrically connected to the control terminal and an insulator in contact with the contiguous zone, the insulator isolating the first electrode from the semiconductor body, wherein the insulator exhibits, at a bottom region of the trench, a first thickness along the vertical direction, and, at a top region of the trench, a second thickness along a first lateral direction, the first thickness being greater than the second thickness by a factor of at least 1.5. In addition, the contiguous zone is arranged in contact with the insulator and extends further along the vertical direction than the trench, wherein the trench bottom region and the contiguous zone exhibit an overlap along the first lateral direction.

According to another embodiment, another semiconductor device is presented that includes a first load terminal, a second load terminal, a control terminal and a semiconductor body having a drift zone, wherein the semiconductor body is formed by a semiconductor material having a bandgap greater than the bandgap of silicon and is configured to conduct a load current between the first load terminal and the second load terminal. The semiconductor device includes a source zone arranged in the semiconductor body and electrically connected to the first load terminal; a contiguous zone arranged in the semiconductor body and isolating the source zone from the drift zone; a trench extending into the semiconductor body along a vertical direction and comprising an insulator in contact with the contiguous zone; and a first electrode arranged within the trench and isolated from the semiconductor body by the insulator, wherein the first electrode is electrically connected to the control terminal; and a second electrode arranged within the trench and isolated from the semiconductor body by the insulator, wherein the insulator isolates the second electrode from the first electrode. In addition, the contiguous zone extends at least as far along the vertical direction as the trench.

According to a yet further embodiment, a method of operating a semiconductor device is presented, wherein the semiconductor device includes a first load terminal, a second load terminal, a control terminal and a semiconductor body having a drift zone, and wherein the semiconductor body is formed by a semiconductor material having a bandgap greater than the bandgap of silicon and is configured to conduct a load current between the first load terminal and the second load terminal. The semiconductor device includes: a source zone arranged in the semiconductor body and electrically connected to the first load terminal; a contiguous zone arranged in the semiconductor body and isolating the source zone from the drift zone; a trench extending into the semiconductor body along a vertical direction and comprising an insulator in contact with the contiguous zone; and a first electrode arranged within the trench and isolated from the semiconductor body by the insulator, wherein the first electrode is electrically connected to the control terminal; and a second electrode arranged within the trench and isolated from the semiconductor body by the insulator, wherein the insulator isolates the second electrode from the first electrode. Further, the contiguous zone extends at least as far along the vertical direction as the trench. The method includes controlling a voltage between the first electrode and the first load terminal for setting the semiconductor device in one of a conducting state and a blocking state; and applying an electrical potential to the second electrode.

Those skilled in the art will recognize additional features and advantages upon reading the following detailed description, and upon viewing the accompanying drawings.

BRIEF DESCRIPTION OF THE DRAWINGS

Embodiments are described herein making reference to the appended drawings. The parts in the figures are not necessarily to scale, instead emphasis being placed upon illustrating principles of the embodiments. Moreover, in the figures, like reference numerals designate corresponding parts. In the drawings:

FIG. 3C schematically illustrates a section of a vertical cross-section of a semiconductor device having a second trench electrode according to one or more embodiments.

DETAILED DESCRIPTION

Figure 1A:
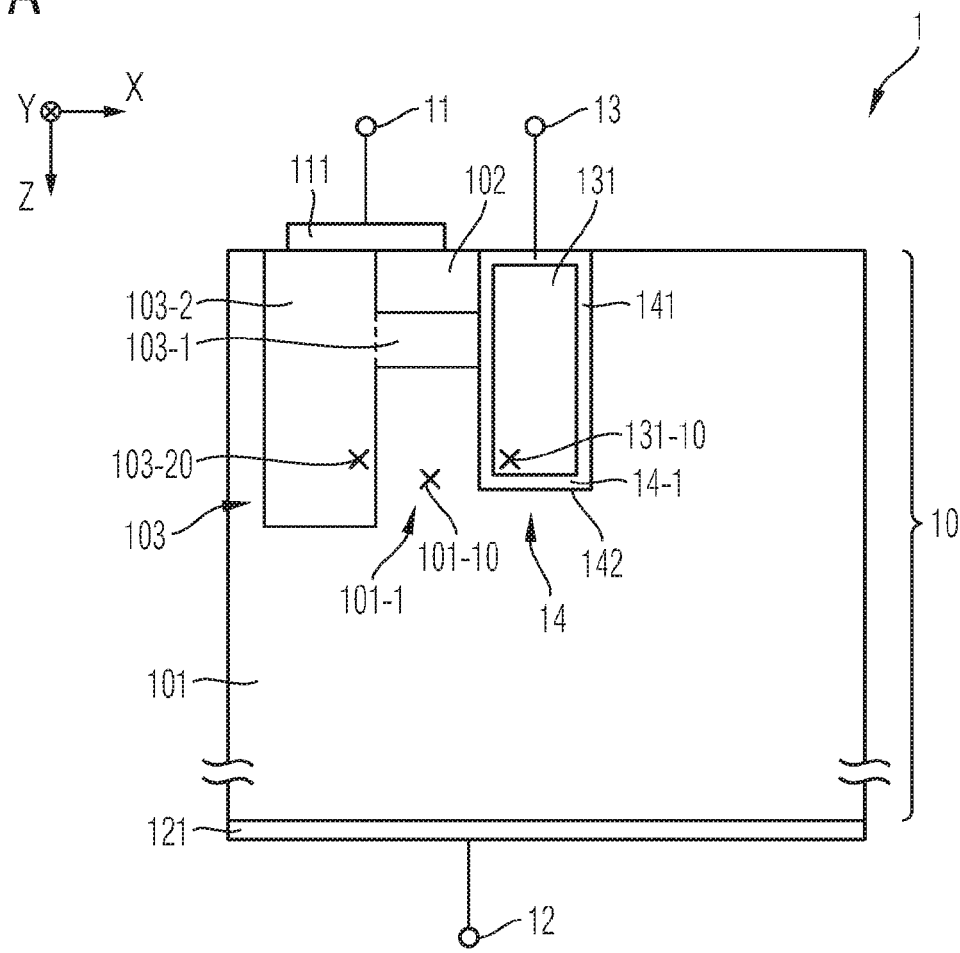
FIG. 1A schematically illustrates a section of a vertical cross-section of a semiconductor device according to one or more embodiments.

In the following detailed description, reference is made to the accompanying drawings which form a part hereof and in which are shown by way of illustration specific embodiments.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the disclosure. For example, features illustrated or described as part of one embodiment can be used on or in conjunction with other embodiments to yield yet a further embodiment. It is intended that the present disclosure includes such modifications and variations. The examples are described using specific language which should not be construed as limiting the scope of the appended claims. The drawings are not scaled and are for illustrative purposes only. For clarity, the same elements have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the direction Z mentioned below may be a vertical direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant or, respectively, to a mean dopant concentration or to a sheet charge carrier concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Specific embodiments described in this specification pertain to, without being limited thereto, a power semiconductor device that may be used within a power converter or a power supply. For example, the power semiconductor device may comprise one or more power semiconductor cells, such as a monolithically integrated diode cell, and/or a monolithically integrated transistor cell, and/or a monolithically integrated IGBT cell, and/or a monolithically integrated MOS Gated Diode (MGD) cell, and/or a monolithically integrated MOSFET cell and/or derivatives thereof. Such diode cells and such transistor cells may be integrated in a power semiconductor module.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 5 V, more typically 15 V and above.

FIG. 1 schematically illustrates a section of a vertical cross-section of a semiconductor device 1 in accordance with one or more embodiments. The semiconductor device 1 comprises a first load terminal 11 and a second load terminal 12. A semiconductor body 10 is configured to conduct a load current between the first load terminal 11 and the second load terminal 12. For example, the semiconductor body 10 may be electrically coupled to both the first load terminal 11 and the second load terminal 12. In an embodiment, the first load terminal 11 is arranged on a front side of the semiconductor body 10, and a second load terminal 12 can be arranged on a back side of a semiconductor body 10. Alternatively, both the first load terminal 11 and the second load terminal 12 may be arranged on either the front side or the back side of the semiconductor body 10.

For example, the semiconductor body 10 is formed by a semiconductor material having a bandgap greater than the bandgap of silicon. Said material can be a wide bandgap material, e.g., silicon carbide (SiC), gallium nitride (GaN), aluminum nitride (AlN), boron nitride (BN), to name a few.

In an embodiment, the material has a bandgap significantly greater than 1 electronvolt (eV). For example, the bandgap is greater than the bandgap of silicon, at a given temperature, such as 302 Kelvin, by at least 1.0 eV. The bandgap of silicon may amount to 1.11 eV. It shall be understood that certain zones of the semiconductor body 10, such as zones 101, 101-1, 102, 103, 103-1 and 103-2 mentioned below and further zones or layers, may also be formed by said semiconductor material that exhibits a bandgap greater than the corresponding bandgap of silicon.

The semiconductor device 1 has a source zone 102 that is arranged in the semiconductor body 10 and electrically connected to the first load terminal 11. To this end, a first metallization 111 can be provided that can be arranged on a surface of the semiconductor body 10 and may be in contact with each of the source zone 102 and the first load terminal 11. For example, the source zone 102 is a semiconductor source zone and has dopants of a first conductivity type at a comparatively high dopant concentration. For example, the source zone 102 is an $n^+$-zone.

The semiconductor device 1 further includes a body zone 103-1 and a shield zone 103-2, which may both be arranged in the semiconductor body 10 and which may form a contiguous zone 103. For example, the body zone 103-1 and the shield zone 103-2 are in contact with each other. The contiguous zone 103 formed by said zones 103-1 and 103-2 can isolate the source zone 102 from a drift zone 101 of the semiconductor body 10. Further, the shield zone 103-2 may also be electrically connected to the first load terminal 11, e.g., by means of said first metallization 111, which may be in contact with the shield zone 103-2. In an embodiment, both the body zone 103-1 and the shield zone 103-2 comprise dopants of the second conductivity type complementary to the first conductivity type, wherein the dopant concentration of the body zone 103-1 may be lower than the dopant concentration of the shield zone 103-2. For example, the shield zone 103-2 is a $p^+$-zone, and the body zone 103-1 is a p-zone.

According to an embodiment, an upper part of the shield zone 103-2 couples the body zone 103-1 to the first metallization 111. Said upper part may have a different maximum dopant concentration as compared to a lower part of the shield zone 103-2 that may extend deeper along the vertical direction Z than the body zone 103-1. For example, the upper part of the shield zone 103-2 may have a higher dopant concentration than the lower part of the shield zone 103-2. Said dopant concentration of the lower part of the shield zone 103-2 may even be lower than the dopant concentration of the body zone 103-1. Further, the upper part of the shield zone 103-2 may form an anti-latch up region. Thus, in accordance with an embodiment, at a section of the shield zone 103-2 that contacts the metallization 111, a very high $p^+$-concentration may be present. This may allow for a good ohmic contact, e.g., also for low ohmic connection between the body zone 103-1 and the metallization 111, which may be, as will be explained below, a part of a source terminal of the semiconductor device 1. For example, the lower part of the shield zone 103-2 may exhibit a lower dopant concentration, since its dominant function may not be an electrostatic one.

The drift zone 101 of the semiconductor body 10 may comprise dopants of the first conductivity type at a rather low dopant concentration. For example, the drift zone 101 is an $n^-$-zone. Thus, a transition between the contiguous zone 103 and the drift zone 101 may constitute a pn-junction that may form a depletion region that may be configured to block a voltage applied between the first load terminal 11 and the second load terminal 12, when the semiconductor device 1 is in a blocking state. When being in a conducting state, the semiconductor device 1 may be configured to carry said load current between the first load terminal 11 and the second load terminal 12 by means of at least the drift zone 101.

The semiconductor device 1 further comprises a trench 14 that extends into the semiconductor body 10 along a vertical direction Z and comprises an insulator 141.

The insulator 141 can be in contact with the contiguous zone 103. For example, the insulator 141 of the trench 14 may be in contact with each of the drift zone 101, the source zone 102 and the contiguous zone 103, such as with the body zone 103-1. The insulator 141 may comprise at least one of silicon dioxide, silicon nitride and a low-k-dielectric. For example, a low-k-dielectric is arranged at a bottom region 14-1 of the trench 14. A low-k-dielectric may have a relative permittivity which is lower than the relative permittivity of silicon dioxide. The low-k-dielectric may have a relative permittivity which is between 1 and 3.9.

A first electrode 131 arranged within the trench 14 can be isolated from the semiconductor body 10 by the insulator 141. The first electrode 131 can be electrically connected to a control terminal 13 of the semiconductor device 1. For example, a control signal may be provided to the first electrode 131 by means of the control terminal 13 so as to set the semiconductor device 1 in one of the blocking state or the conducting state.

As illustrated in FIG. 1A, the drift zone 101 may comprise a mesa section 101-1 that is arranged below the body zone 103-1 and that separates, along a first lateral direction X, the shield zone 103-2 from the trench 14. The mesa section 101-1, as being a part of the drift zone 101, may also comprise dopants of the first conductivity type at a rather low dopant concentration. Thus, the mesa section 101-1 can also be an $n^-$-region. In other words, the mesa section 101-1 may be a part of the drift zone 101 that is laterally confined by the shield zone 103-2 on the one side and by the trench 14 on the other side. For example, a side wall of the trench 14 that laterally confines the mesa section 101-1 is the same side wall that is also in contact with the body zone 103-1.

In an embodiment, the shield zone 103-2 extends further along the vertical direction Z than the body zone 103-1. Thus, as explained above, said mesa section 101-1 may be the part of the drift zone 101 that is laterally confined, along the first lateral direction X, by the shield zone 103-2 and the trench 14, and that is vertically confined, along the vertical direction Z, by the body zone 103-1. For example, the shield zone 103-2 may extend as far as or even further along the vertical direction Z than the trench 14. For example, the shield zone 103-2 extends along the vertical direction Z for at least 1 µm.

The configuration of the semiconductor device 1 as illustrated in FIG. 1A or, respectively, in one of FIG. 2 and FIG. 3A-C described below, can be employed for forming a power semiconductor device, such as a MOSFET, e.g., a SiC-MOSFET, or a SiC-IGBT or another power semiconductor device, such as another unipolar or bipolar wide bandgap semiconductor device. Accordingly, the first load terminal 11 may be a source terminal, the second load terminal 12 may be a drain terminal and the control terminal 13 can be a gate terminal. Such semiconductor device may include a plurality of transistor cells, wherein each transistor cell may comprise a MOS control head formed by at least a respective drift zone 101, source zone 102, contiguous zone 103 and a respective trench 14. It shall be understood that the semiconductor body 10 may comprise a further semiconductor layer (not illustrated), such as a highly doped substrate layer and/or a semiconductor contact layer that is used by each of said transistor cells. Further, it shall be understood that the semiconductor body 10 can be electrically connected to the second load terminal 12 by means of a second metallization 121, which can be, e.g., a back side metallization of the semiconductor device 1.

In the following, some embodiments of the semiconductor device 1 shall be described with respect to each of FIG. 1A to FIG. 3C. It shall be understood that what has been described above with specific regard to FIG. 1A concerning the semiconductor body 10, the terminals 11, 12 and 13, and the zones and layers that may be included in the semiconductor body 10, such as zones 101, 101-1, 102, 103, 103-1 and 103-2, may equally apply to each of the embodiments illustrated in FIG. 2 to FIG. 3C. Vice versa, the additional features described with respect to one or more of FIG. 2 to FIG. 3C may also be implemented in the embodiment in accordance with FIG. 1A, if not stated otherwise.

Figure 1B:
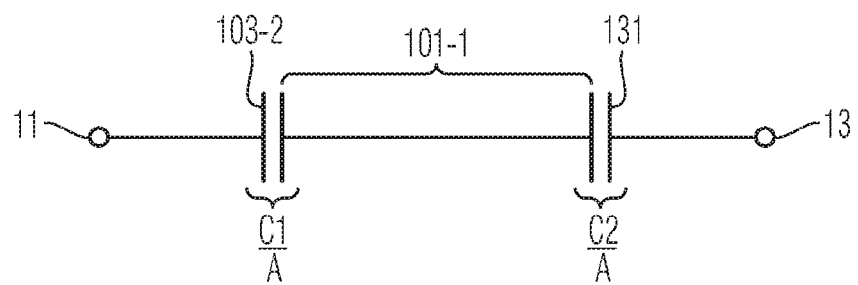
FIG. 1B schematically illustrates a section of an electrical capacitance circuit equivalent to a section of a semiconductor device according to one or more embodiments.

Regarding now FIGS. 1A and 1B, in accordance with an embodiment, a first capacitance per unit area C1/A formed by an area included in the mesa section 101-1 and by an area included in the shield zone 103-2 is greater than a second capacitance per unit area C2/A formed by the area included in the mesa section 101-1 and an area included in the first electrode 131, e.g., if the semiconductor device is in a blocking state. For example, the area included in the mesa section 101-1 is at least a part of a first boundary area of said depletion region formed by the shield zone 103-2 and the drift zone 101. The area included in the shield zone 103-2 may at least be a part of a second boundary area of the depletion region. Further, the area included in the first electrode 131 can be at least a part of an electrode surface in contact with the insulator 141. Each of said areas may exhibit the same size and also extend along a second lateral direction Y.

The latter aspect is schematically illustrated by FIG. 1B, which depicts a section of an equivalent capacitance circuit. Accordingly, the shield zone 103-2 may be electrically connected to the first load terminal 11 and, thus, exhibit the substantially same electrical potential as the first load terminal 11. Said area included in the shield zone 103-2 may form a first capacitor plate of a first fictitious capacitor. On the other side, the first electrode 131 may be electrically connected to the control terminal 113 and, thus, exhibit the substantially same electrical potential as the control terminal 13. Accordingly, said area included in the first electrode 131 may form a first capacitor plate of a second fictitious capacitor, as illustrated in FIG. 1B. Said area included in the mesa section 101-1 may exhibit another electrical potential, e.g., due to fixed electrical charge being present within said area of the mesa section 101-1. This area of the mesa section 101-1 can thus form a second capacitor plate of both the first fictitious capacitor C1 and the second fictitious capacitor C2.

A reference point 101-10 within the mesa section 101-1 is positioned at least as deep as the bottom 142 of the trench 14 and at a center of a distance along the first lateral direction X between the shield zone 103-2 and the trench 14. Further, there may be a first distance between the reference point 101-10 and a first point 103-20 within the shield zone 103-2 and a second distance between the reference point 101-10 and a second point 131-10 within the first electrode 131. For example, both the first point 103-20 and the second point 103-10 are arranged at the same depth level, i.e., at the same position along the vertical direction Z, e.g., at a level substantially equal to a level of a lower end of the first electrode 131. For example, the second point 131-10 is arranged at the lower corner of the first electrode facing to the mesa section 101-1 and the first point 103-20 can be part of said second boundary area of the depletion region. The first distance and the second distance may each amount to same value.

In an embodiment, at a given section of a vertical cross-section, a first-permittivity-to-first-distance-ratio is greater than a second-permittivity-to-second-distance-ratio, wherein the first permittivity is effective along the first distance (i.e., between the reference point 101-10 and the first point 103-20) and the second permittivity is effective along the second distance (i.e., between the reference point 101-10 and the second point 131-10). For example, the following equation (1) may thus apply, according to which a first integral-over-distance (x) is greater than a second integral-over-distance (x):

$$\int_{101-10}^{103-20} \frac{\varepsilon_1(x)}{d_1} dx > \int_{101-10}^{131-10} \frac{\varepsilon_2(x)}{d_2} dx \qquad (1)$$

wherein $\varepsilon_1(x)/d_1$ is the first permittivity effective along the first distance and $\varepsilon_2(x)/d_2$ is the second permittivity effective along the second distance.

For example, the first capacitance per unit area C1/A can be greater than the second capacitance per unit area C2/A by a factor of at least 1.5, 2, 5, or by a factor of even greater or equal to 10. Accordingly, said first-permittivity-to-first-distance-ratio may be greater than said second-permittivity-to-second-distance-ratio by a factor of at least 1.5, 2, 5, or by a factor of even greater or equal to 10.

In an embodiment, the above described relation between the first capacitance per unit area C1/A and the second capacitance per unit area C2/A and/or, respectively, between the first-permittivity-to-first-distance-ratio and the second-permittivity-to-second-distance-ratio can be present if a negative voltage is applied between the control terminal 13 and the first load terminal 11, e.g., if the electrical potential of the first control electrode 131 is lower than the electrical potential present at the first load terminal 11. Such configuration of the semiconductor device 1 may allow for achieving a comparatively low electrical field within the insulator 141 effective between the first electrode 131 and the mesa section 101-1.

In accordance with an embodiment, when applying a blocking voltage between the first load terminal 11 and the second load terminal 12, the drift zone 101 will be depleted of mobile charge carriers at least in a portion of the drift zone 101 which is adjacent to the contiguous zone 103 (e.g., the mesa section 101-1), thereby leaving said fixed electrical charge of the ionized doping atoms in the depleted zone. Each ionized doping atom may carry, e.g., one quantized elementary charge, in case of an ionized donor, e.g., one positive elementary charge. The fixed charge in the depleted zone thus is limited by the amount of doping atoms in the depleted zone. The ionized doping atoms at said reference point 101-10 may find their mirror charges of opposite sign. Each pair of charge and mirror charge may represent an electric field vector and the electric field may be the number of electric field vectors permeating a hypothetical area or unit area. When fulfilling eq. (1), it is more attractive for the ionized doping atoms at said reference point 101-10 to find the mirror charge at the first point 103-20 than at the second point 131-10, i. e., more mirror charges will be found at the first point 103-20 than at the second point 131-10 since the total amount of charges at the reference point 101-10 is limited. Thus, the number of electric field vectors and the electric field between the reference point 101-10 and the second point 131-10, which is the electric field in the insulator 141, is lower than between the reference point 101-10 and the first point 103-20.

Figure 2:
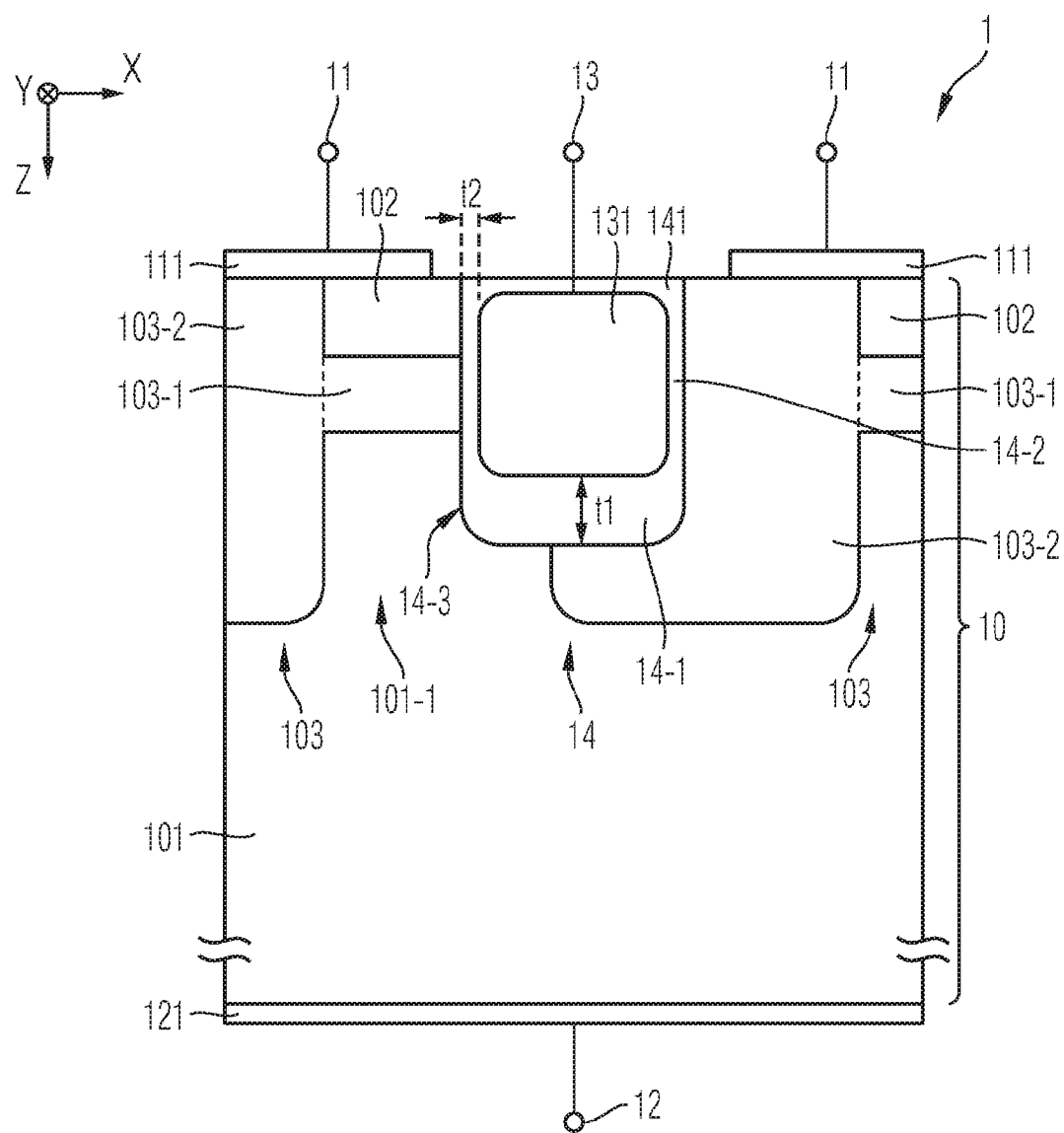
FIG. 2 schematically illustrates a section of a vertical cross-section of a semiconductor device having a thick gate bottom oxide according to one or more embodiments.

As explained above, the general configuration of the embodiment of the semiconductor 1 schematically illustrated in FIG. 2 may correspond to the configuration of the embodiment of the semiconductor 1 illustrated in FIG. 1A. In FIG. 2, sections of two of said MOS control heads are schematically illustrated. Accordingly, a second transistor cell may be arranged on the right side next to the trench 14, wherein there may be arranged a separate trench (not illustrated) belonging to the transistor cell next to trench 14. In accordance with an embodiment, the insulator 141 exhibits, at bottom region 14-1 of the trench 14, a first thickness t1 along the vertical direction Z, and, at a top region 14-2 of the trench 14, a second thickness t2 along the first lateral direction X. For example, the first thickness t1 is greater than the second thickness t2 by a factor of at least 1.5, 2, 3, 5 or even greater or equal to a factor of 10. For example, the second thickness t2 amounts to at least 30 nm, to at least 50 nm, to at least 75 nm, to at least 0.1 μm, to at least 0.5 μm, 1.0 μm, or is even greater than 1.0 μm. For example, by adjusting a certain first thickness t1, also the electrical field present in the insulator 141 in the bottom region 14-1 can be adjusted.

For example, the thickness of the insulator 141 at the bottom region 14-1 amounts to at least t1 along the entire extension of the trench bottom region 14-1 along the first lateral direction X. In other words, in an embodiment, the thickness along the vertical direction Z at the trench bottom region 14-1 is not smaller than t1. Further, in an embodiment, the thickness of the insulator 141 in the trench top region 14-2 along the first lateral direction X amounts to no more than t2, at least in a section where the body zone 103-1 and the first electrode 131 exhibit an overlap along the vertical direction Z.

In an embodiment, due to the comparatively thick bottom insulator in the trench 14, said relations between the first and the second capacitances per unit area or, respectively, between the first-permittivity-to-first-distance-ratio and the second-permittivity-to-second-distance-ratio as explained above can be achieved. This may allow for achieving a comparatively low electrical field within the insulator 141 of the trench 14.

The contiguous zone 103 can be arranged in contact with the insulator 141 and may extend further along the vertical direction Z than the trench 14. In addition, the trench bottom region 14-1 and the contiguous zone 103 may exhibit an overlap along the first lateral direction X. The contiguous zone 103 can be formed by said body zone 103-1 and said shield zone 103-2. Further, the shield zone 103-2 can be electrically connected to the first load terminal 11. The dopant concentration of the shield zone 103-2 can be greater as the dopant concentration of the body zone 103-1. The trench bottom region 14-1 and the shield zone 103-2 may exhibit said overlap.

As illustrated in FIG. 2, the shield zone 103-2 of the transistor cell on the right of the trench 14 may be in contact with the insulator 141 and extend further along the vertical direction Z than the trench 14. Further, the trench bottom region 14-1 and said neighboring shield zone 103-2 may exhibit said overlap along the first lateral direction X. For example, this overlap amounts to at least 30% and to no more than 65% or no more than 95% or no more than 115% of the total extension of the trench bottom region 14-1 along the first lateral direction X. Since this neighboring shield zone 103-2 does not totally isolate the trench 14 from the drift zone 101, even when the shield zone 103-2 covers the whole bottom region 14-1, a trench corner region 14-3 of the trench 14 may be exposed to, e.g., be in contact with the drift zone 101. In a sense, this trench corner region 14-3 may thus not be "protected" by the neighboring shield zone 103-2. It shall be understood that such neighboring shield zone 103-2 can also be part of the embodiment according to FIG. 1A, even though it is not illustrated in FIG. 1A. In accordance with one or more embodiments, said comparatively low electric field is achieved within a section of the insulator 141 that is part of the trench corner region 14-3.

Figure 3A:
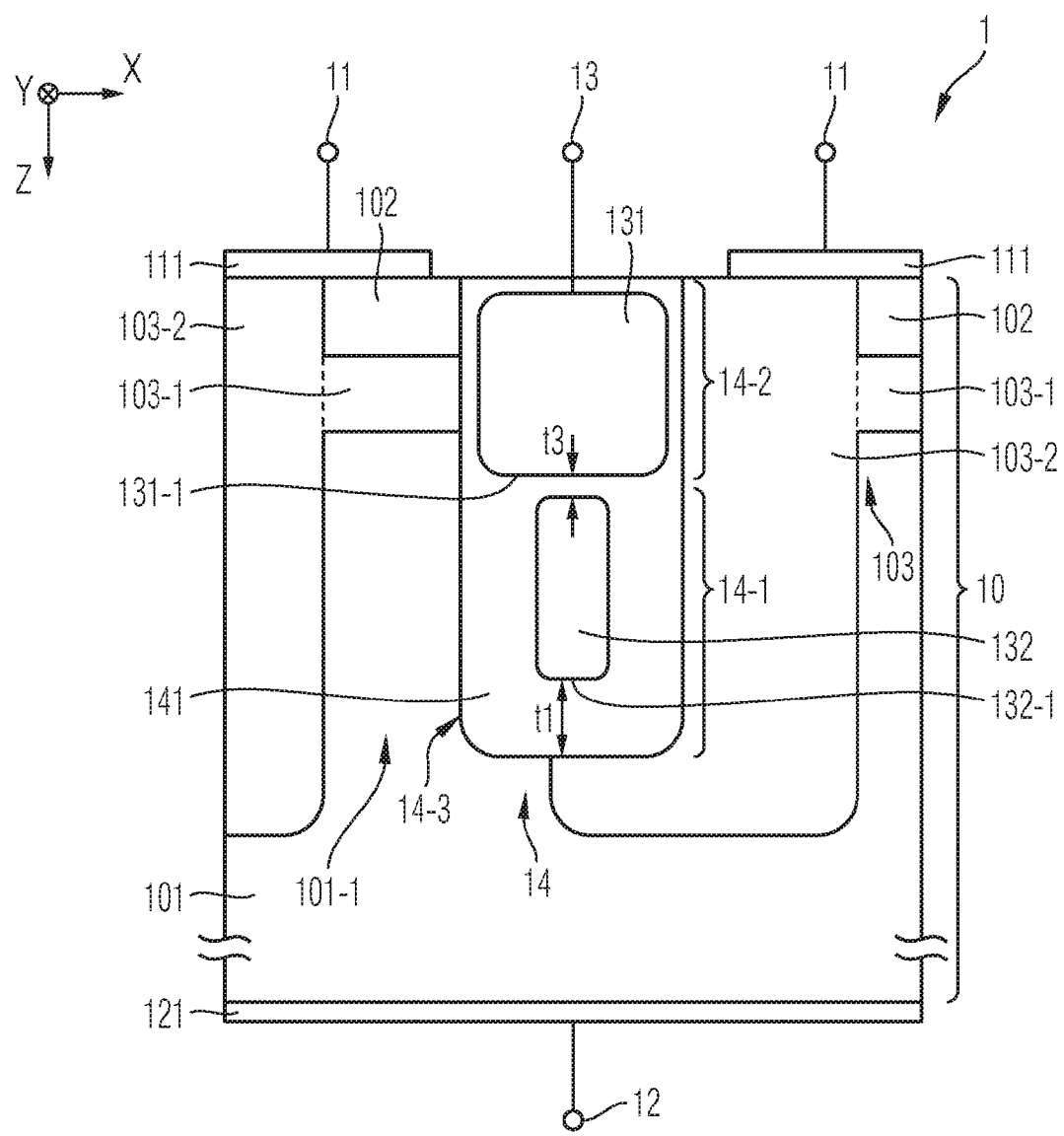
FIG. 3A schematically illustrates a section of a vertical cross-section of a semiconductor device having a second trench electrode according to one or more embodiments.
Figure 3B:
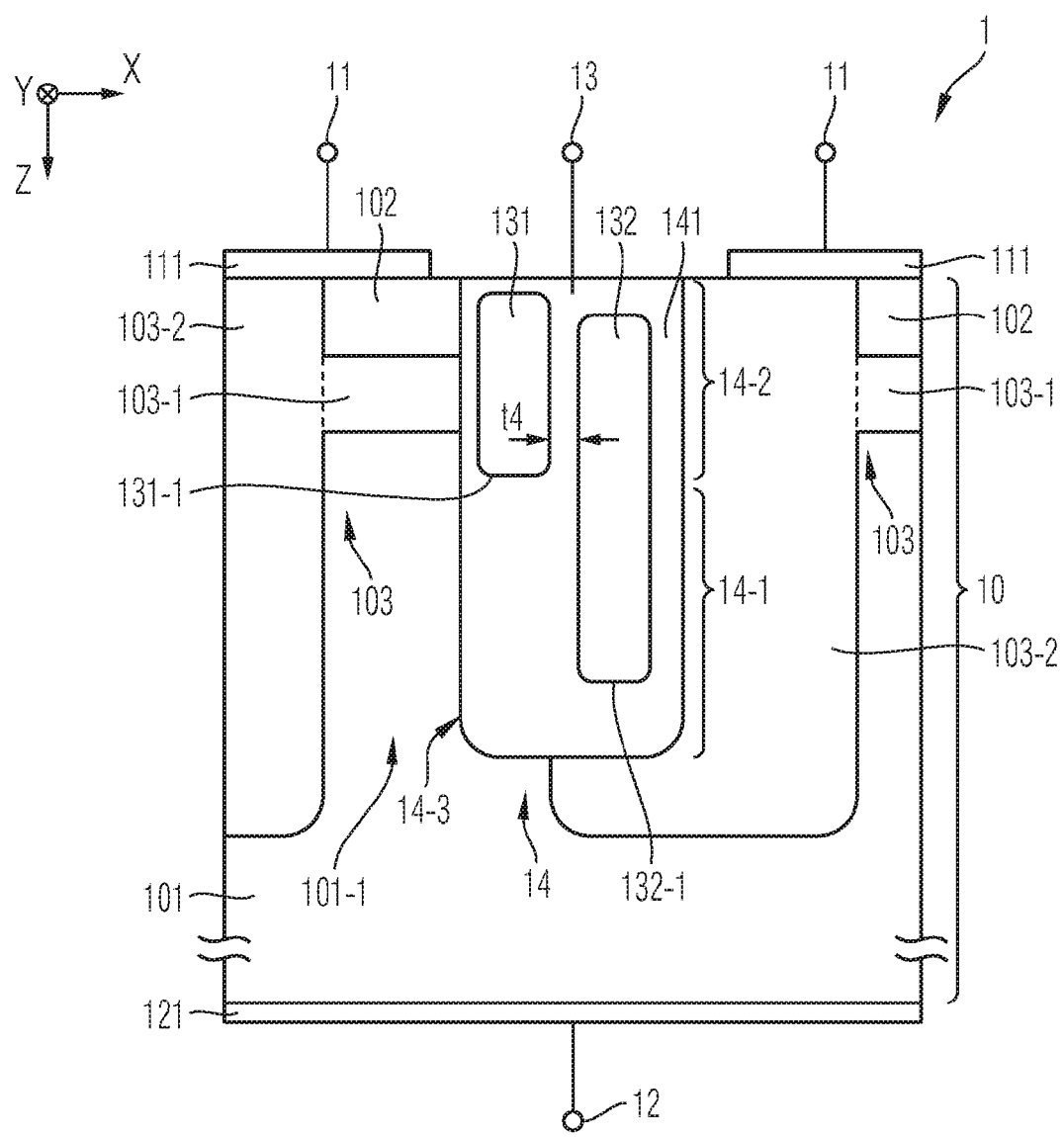
FIG. 3B schematically illustrates a section of a vertical cross-section of a semiconductor device having a second trench electrode according to one or more embodiments.

Each of FIG. 3A-C schematically illustrates a respective section of a vertical cross section of further embodiments of the semiconductor device 1. In accordance with these embodiments, a second electrode 132 is provided that may be included in the trench 14 that also comprises the first electrode 131. What has been stated about the remaining components of the semiconductor device 1, e.g., the terminals 11, 12 and 13, the semiconductor body 10, the semiconductor zones 101, 102 and 103 with respect to the embodiments in accordance with FIG. 1A to FIG. 2 may equally apply to the embodiments illustrated in FIG. 3A-C. For example, the contiguous zone 103 may extend at least as far along the vertical direction Z as the trench 14. The contiguous zone 103 can be arranged in contact with the insulator 141 and may extend further along the vertical direction Z than the trench 14. In addition, the trench bottom region 14-1 and the contiguous zone 103-2 may exhibit an overlap along the first lateral direction X. The contiguous zone 103 can be formed by said body zone 103-1 and said shield zone 103-2. Further, the shield zone 103-2 can be electrically connected to the first load terminal 11. The dopant concentration of the shield zone 103-2 can be greater as the dopant concentration of the body zone 103-1. The trench bottom region 14-1 and the shield zone 103-2 may exhibit said overlap in the first lateral direction X.

In accordance with those variants illustrated by each of FIG. 3A to FIG. 3C, a lower end 132-1 of the second electrode 132 may extend further along the vertical direction Z than a lower end 131-1 of the first electrode 131. For example, the distance along the vertical direction Z between the lower end 131-1 of the first electrode 131 and the lower end 132-1 of the second electrode 132 amounts to at least 1 μm.

For example, the second electrode 132 is implemented as a field plate.

The first electrode 131 and the second electrode 132 may be formed by different materials. For example, the electric conductivity of the second electrode 132 is lower than the electric conductivity of the first electrode 131, for example by a factor of at least 1.5. In another embodiment, the materials of the first electrode 131 and the second electrode 132 may be identical to each other.

The second electrode 132 can be arranged within the trench 14 and can be isolated from the semiconductor body 10 by the insulator 141. The insulator 141 may further isolate the second electrode from the first electrode 131. Thus, the first electrode 131 and the second electrode 132 may be arranged separately from each other and can be electrically insulated from each other.

Even though the two electrodes 131 and 132 may be arranged separately from each other, the two electrodes 131 can either be electrically connected to each other or, alternatively, electrically insulated from each other. For example, the second electrode is electrically connected to one of the first load terminal 11 and the first electrode 11. Thus, the electrical potential of the second electrode 132 can be substantially identical to one of the electrical potential of the first electrode 131 or the electrical potential of the first load terminal 11.

In an embodiment, an electrical potential of the second electrode 132 is controlled separately, e.g., independently from a control of an electrical potential that may be applied to the first electrode 131. For example, the electrical potential of the second electrode 132 is controlled such that the electric field within the insulator 141, e.g. in a section of the insulator 141 part of said trench corner region 14-3, is comparatively low. In an embodiment, due to the second electrode 132, said relations between the first and the second capacitances per unit area or, respectively, between the first-permittivity-to-first-distance-ratio and the second-permittivity-to-second-distance-ratio as explained above can be achieved. This optional aspect is described in more detail further below.

Further, it shall be understood that the second electrode 132 and the first electrode 131 must not necessarily be arranged within a common trench. For example, the second electrode 132 can be arranged in a separate trench (not illustrated) arranged laterally adjacent to the trench that includes the first electrode 131.

Regarding now in more detail FIG. 3A, the second electrode 132 may arranged entirely below the first electrode 131. For example, the thickness t3 of the insulator 141 between the first electrode 131 and the second electrode 132 along the vertical direction Z is determined in dependence of a voltage difference that may be present between the first electrode 131 and the second electrode 132. The thickness t3 may be as great or even greater than the thickness t1 mentioned above.

In accordance with another embodiment that is schematically illustrated in FIG. 3B, the second electrode 132 may be arranged laterally adjacent to the first electrode 131. Still, the insulator 141 of the trench 14 may isolate the two electrodes 131 and 132 from each other. Again, the thickness t4 of the insulator 141 between the first electrode 131 and the second electrode 132 along the first lateral direction X may be determined in dependence of a voltage difference that may be present between the first electrode 131 and the second electrode 132. The thickness t4 may be as great or even greater than the thickness t1 mentioned above. The first and the second electrodes 131 and 132 may exhibit substantially same spatial dimensions along the first and second lateral directions X and Y, wherein the total extension along the vertical direction Z of the second electrode 132 may be greater than the total extension along the vertical direction Z of the first electrode 131 by a factor of at least 1.5 or of at least 2. This may also result in an increased thickness of the insulator 141 in the bottom region 14-1 as compared to the thickness of the insulator 141 in the top region 14-2 of the trench 14. In contrast to the illustration of FIG. 3B, the thicknesses of the insulator 141 along the first lateral direction that between the sidewalls of the trench 14 and the electrodes 131, 132 may be substantially identical to each other.

Regarding now in more detail the embodiment schematically illustrated in FIG. 3C, the semiconductor body 10 may comprise an active region 1-1 and an edge region 1-2 surrounding the active region 1-1. The active region 1-1 and the edge region 1-2 may be in contact with each other. The drift zone 101, the source zone 102 and the contiguous zone 103 may each be arranged in the active region 1-1. For example, the semiconductor device 1 is configured to carry the load current between the first load terminal 11 and the second load terminal 12 mainly by means of the active region 1-1. Further, in an embodiment, the edge region 1-2 is not configured to carry a load current.

The edge region 1-2 may comprise a guard zone 16 that can be configured to extend said depletion region formed by the transition between the contiguous zone 103 and the drift zone 101. Further, as illustrated in FIG. 3C, the drift zone 101 may extend into the edge region 1-2 and may be in contact with the guard zone 16.

For example, the guard zone 16 comprises one or more guard rings 161 and 162 that surround the active region 1-1. The employment of a guard zone, e.g., one or more guard rings, within the edge region of a semiconductor device, as well as possible arrangements and configurations of such a guard zone 16 are known to the skilled person and shall not be explained in more detail. For example, each of the guard rings 161, 162, the body zone 103-1, the shield zone 103-2, the source 102 can be arranged within the semiconductor body 10 such that they exhibit an overlap along the vertical direction Z of at least 0.5 μm. Each of the guard rings 161 and 162 may comprise dopants complementary to the dopants of the drift zone 101. According to an embodiment, each of the guard rings 161 and 162 may have dopants of the second conductivity type. For example, each of the guard rings 161 and 162 is p-doped.

The semiconductor device 1 may further comprise an electrically conductive path 15 that is coupled to the second electrode 132 and that may be configured to provide a signal to the second electrode 132. This signal can be different from the control signal that may be provided to the first electrode 131 by means of the control terminal 13. This signal can be provided by an external source, e.g., a gate driver (not illustrated).

For example, the electrically conductive path 15 connects the guard zone 16 to the second electrode 132. Thus, the electrical potential of the second electrode may depend on the electrical potential of the guard zone 16. In another embodiment, the electrically conductive path 15 connects the second electrode 132 to another section of the semiconductor body 10, said section belonging either to the active region 1-1 or the edge region 1-2.

The guard zone 16 may be doped, e.g., as explained above, and the electrically conductive path 15 may comprise a semiconductor region 151 doped complementary to the guard zone 16. For example, said semiconductor region 151 can be included in one or more of the guard rings 161 and 162 and can be n-doped. In an embodiment, the electrically conductive path 15 electrically connects the semiconductor region 151 to the second electrode 132, and the semiconductor region 151 may be included in the first guard ring 161.

For example, if a blocking voltage is applied between the first load terminal 11 and the second load terminal 12, the electrical potential of the second electrode 132 is essentially identical to the electrical potential of the first guard ring 161, e.g., to of a low-voltage-point of the first guard ring 161. For example, during each change from the blocking state to the conducting state of the semiconductor device 1, the second electrode 132 is discharged down to a voltage corresponding to the forward voltage of the pn-junction formed by the first guard ring 161 and the drift zone 101. If such discharge shall not occur, said semiconductor region 151 can be provided, in accordance with an embodiment. Due to the electrical conductive path 15 connected to the semiconductor body, e.g., guard zone 16, the electrical potential of the second electrode 132 may follow, e.g., be substantially identical to, the electrical potential of the drift zone 101; thereby, the insulator 141 is not exposed to high voltages and high electric fields within the insulator 141 may be avoided, in accordance with an embodiment. However, as explained above, care must be taken that in this case the insulator 141 between the first electrode 131 and the second electrode 132 can withstand the voltage difference of both the first and second electrode 131, 132. The thickness (cf. thickness t3 or t4 in FIG. 3A-C) of the insulator in between the first and second electrode 131, 132 must be selected accordingly.

In accordance with an embodiment, a method of operating a semiconductor device, for example, the semiconductor device 1 schematically illustrated in one of FIG. 3A-3C is presented. The method comprises controlling a voltage between the first electrode 131 and the first load terminal 11 for setting the semiconductor device 1 in one of the conducting state and the blocking state. For example, for setting the semiconductor device 1 in the blocking state, a negative voltage or 0 V is applied between the first electrode 131 and the first load terminal 11. For example, a depletion region is then formed by the drift zone 101 and the contiguous zone 103, more specifically by a pn-junction formed by a transition between the contiguous zone 103 and the drift zone 101. This depletion zone may be configured for blocking a voltage applied between the first load terminal 11 and the second load terminal 12. For setting the semiconductor device in a conducting state in which a load current may be conducted between the first load terminal 11 and the second load terminal 12, a positive voltage between the first electrode 131 and the first load terminal 11 may be applied.

The method may further include the step of applying an electrical potential to the second electrode 132. In an embodiment, the electrical potential applied to the second electrode 132 is a defined electrical potential, for example, one of the electrical potential of the first load terminal 11 and the first electrode 131. For example, electrical potential is applied to the second electrode 132 such that the voltage between the second electrode 132 and the first load terminal 11 is greater than the voltage between the first electrode 131 and the first load terminal 11, for example, when the semiconductor 1 is a blocking state. For example, this may allow for reducing the electrical field within the insulator 141 of the trench 14. For example, regarding the embodiment of the semiconductor 1 in accordance with FIG. 3C, the electrical potential applied to the second electrode 132 may be controlled by means of the voltage defined by the voltage between the first load terminal 11 and the guard ring 161 in the blocking state. For example, regarding the embodiment of the semiconductor 1 in accordance with FIG. 3C, the electrical potential applied to the second electrode 132 may be controlled by means of the breakthrough voltage defined by pn-junction formed between a transition of the semiconductor region 151 and the guard ring 161.

If the semiconductor device 1 is in a conducting state, the electrical potential applied to the second electrode 132 may be equal to the electrical potential applied to the first electrode 131. Thus, during the conducting state, a voltage between the first electrode and the first load terminal 11 may be identical to a voltage between the second electrode 132 and the first load terminal 11. If the semiconductor device 1 is in a blocking state, the electrical potential applied to the second electrode 132 may be different from the electrical potential applied to the first electrode 131, as explained above. For example, during the blocking state, the voltage between the first electrode 131 and the first load terminal 11 and the voltage between the second electrode 132 and the first load terminal may exhibit different signs, e.g., the voltage between the first electrode 131 and the first load terminal 11 is negative and the voltage between the second electrode 132 and the first load terminal is positive or, respectively, substantially zero. For example, such control of the electric potential of the second electrode may allow for reducing the electric field present within the insulator 141 and/or for spreading the load current within the mesa section 101-1 and/or for inducing an accumulation channel along the second electrode 132 in the conducting state.

For example, for controlling the electrical potential of the second electrode 132, the signal that may be provided to the first electrode 131 is used. For example, a gate driver (not illustrated) is employed for generating the signal to be provided to the first electrode 131, as it is known to the skilled person. In accordance with an embodiment, a circuit arrangement, e.g., a diode network comprising one or more diodes, is used that receives said signal provided by the gate driver and transforms it in a second signal that may be provided to the second electrode 132. In another embodiment, for controlling the electrical potential of the second electrode 132, a voltage may be used which may be provided to the second electrode 132 via a conductive connection, wherein the conductive connection may include, e. g., a separate pad (not illustrated). Thus, said pad, which may be arranged external of the semiconductor body 10, can be electrically connected to the second electrode 132 and may provide said voltage to the second electrode 132. Said voltage may be a fixed voltage, e.g., a voltage that is substantially constant in magnitude.

The embodiments schematically illustrated in FIG. 1A to FIG. 3C as described above include the recognition that, for silicon based semiconductor devices, the location of a breakthrough can be defined by a critical electrical field present in bulk silicon, since this critical field can be significantly lower than the critical field of silicon dioxide. However, regarding wide bandgap semiconductor devices, such as SiC-based semiconductor devices, the location of the breakthrough may be in proximity of the oxide, e.g., of the insulator included in a trench. Due to the increased critical field of wide bandgap semiconductor devices, it can be desirable that the maximum of an electrical field within an oxide, e.g., the insulator of a trench, is below a certain threshold value, such as 3 MV/cm or such as 2 MV/cm. Regarding, for instance, a wide bandgap trench MOSFET, a high electrical field within the insulator of the trench may occur during the blocking state, e.g., when a negative voltage is applied to the gate electrode that may be included in the trench. For example, a trench corner region of the trench that is not isolated from the drift zone by means of a shield zone may comprise the point where the highest electrical field occurs. In accordance with one or more of the embodiments describe above, a reduction of the electrical field being present within said region of the trench can be achieved by providing a thicker insulator in the bottom region of the trench (cf. embodiment in accordance with FIG. 2) and/or by providing a second electrode (cf. embodiments in accordance with FIG. 3A-3C).

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to semiconductor devices and to methods of operating a semiconductor device were explained. For example, these semiconductor devices are based on a wide bandgap semiconductor material, such as silicon carbide (SiC), aluminum nitride (AN), gallium nitride (GaN), or boron nitride (BN), to name a few. Accordingly, a semiconductor region or layer, e.g., the semiconductor zones 101, 101-1, 102, 103, 103-1, and 103-2 of exemplary embodiments described above, can be a doped SiC-region or SiC-layer.

It should, however, be understood that the semiconductor regions 101, 101-1, 102, 103, 103-1, 103-2 of exemplary embodiments described above can be made of any wide bandgap semiconductor material suitable for manufacturing a semiconductor device.

Spatially relative terms, such as "under", "below", "lower", "over", "upper", "right", "left" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device comprising a first load terminal, a second load terminal, a control terminal and a semiconductor body having a drift zone, wherein the semiconductor body is formed by a semiconductor material having a bandgap greater than the bandgap of silicon and is configured to conduct a load current between the first load terminal and the second load terminal, the semiconductor device comprising:
   a source zone arranged in an active region of the semiconductor body and electrically connected to the first load terminal;
   a contiguous zone arranged in the active region of the semiconductor body and isolating the source zone from the drift zone; and
   a first trench extending into the active region of the semiconductor body along a vertical direction and comprising a first electrode electrically connected to the control terminal and first insulator in contact with the contiguous zone, the first insulator isolating the first electrode from the semiconductor body,
   wherein:
   in the active region of the semiconductor body, the contiguous zone is arranged in contact with the first insulator and extends further along the vertical direction than the first trench, wherein the bottom region of the first trench and the contiguous zone overlap along the first lateral direction.

2. The semiconductor device of claim 1, wherein the contiguous zone is formed by a body zone and a shield zone, and wherein the shield zone is electrically connected to the first load terminal.

3. The semiconductor device of claim 2, wherein a dopant concentration of the shield zone is greater than a dopant concentration of the body zone.

4. The semiconductor device of claim 2, wherein the bottom region of the first trench and the shield zone overlap along the first lateral direction.

5. The semiconductor device of claim 1, further comprising:
   a second trench extending into the active region of the semiconductor body along the vertical direction, wherein contiguous zone extends from the first insulator of the first trench to a second insulator of the second trench.

6. The semiconductor device of claim 1, further comprising:
   a second trench extending into the active region of the semiconductor body along the vertical direction, and includes a second insulator isolating a second electrode disposed in the second trench from the semiconductor body,
   wherein the first trench includes a first lateral side and a second lateral side opposite to the first lateral side, and
   the contiguous zone, arranged in the active region of the semiconductor body, comprises:
   a first body zone that isolates the source zone from the drift zone and is in contact with the first insulator at the first lateral side;
   a first shield zone that extends from the first body zone and contacts the second insulator of the second trench, wherein the first shield zone extends further along the vertical direction than the first trench and the second trench, and overlaps a bottom region of the second trench along the first lateral direction; and
   a second shield zone in contact with the first insulator at the second lateral side, extends further along the vertical direction than the first trench, and overlaps the bottom region of the first trench at the second lateral side along the first lateral direction.

7. The semiconductor device of claim 6, wherein the drift zone includes a mesa section arranged under the first body zone and is arranged between first insulator and the first shield zone.

8. The semiconductor device of claim 7, wherein the mesa section overlaps the bottom region of the first trench at the first lateral side along the first lateral direction.

9. The semiconductor device of claim 6, wherein the contiguous zone further comprises:
   a second body zone that extends from the second shield zone to contact a third insulator of a third trench extending into the active region of the semiconductor body along the vertical direction, the second body zone isolating another source zone from the drift zone.

10. The semiconductor device of claim 1, further comprising:
    a second trench extending into the active region of the semiconductor body along the vertical direction, and includes a second insulator isolating a second electrode disposed in the second trench from the semiconductor body,
    wherein the first trench includes a first lateral side and a second lateral side opposite to the first lateral side, and
    the contiguous zone, arranged in the active region of the semiconductor body, comprises:
    a first body zone that isolates the source zone from the drift zone and is in contact with the first insulator at the first lateral side;

a first shield zone in contact with the first insulator at the second lateral side, extends further along the vertical direction than the first trench, and overlaps the bottom region of the first trench at the second lateral side along the first lateral direction; and a second body zone that extends from the first shield zone to contact the second insulator, and isolates another source zone from the drift zone.

11. The semiconductor device of claim 10, wherein the drift zone includes a mesa section arranged under the second body zone and is arranged between second insulator and the first shield zone.

12. The semiconductor device of claim 11, wherein the mesa section overlaps the bottom region of the second trench along the first lateral direction.

13. The semiconductor device of claim 10, wherein the contiguous zone further comprises:

a second shield zone that extends from the first body zone and contacts a third insulator of a third trench extending into the active region of the semiconductor body along the vertical direction, the second shield zone extending further along the vertical direction than the first trench and the third trench, and overlaps a bottom region of the third trench along the first lateral direction.

14. A semiconductor device comprising a first load terminal, a second load terminal, a control terminal and a semiconductor body having a drift zone, wherein the semiconductor body is formed by a semiconductor material having a bandgap greater than the bandgap of silicon and is configured to conduct a load current between the first load terminal and the second load terminal, the semiconductor device comprising:

a source zone arranged in the semiconductor body and electrically connected to the first load terminal;

a contiguous zone arranged in the semiconductor body and isolating the source zone from the drift zone;

a trench extending into the semiconductor body along a vertical direction and comprising an insulator in contact with the contiguous zone; and a first electrode arranged within the trench and isolated from the semiconductor body by the insulator, wherein the first electrode is electrically connected to the control terminal; and a second electrode arranged within the trench and isolated from the semiconductor body by the insulator, wherein the insulator isolates the second electrode from the first electrode, wherein the contiguous zone extends at least as far along in the vertical direction as the trench.

15. The semiconductor device of claim 14, wherein a lower end of the second electrode extends further along in the vertical direction than a lower end of the first electrode.

16. The semiconductor device of claim 14, wherein the electric conductivity of the second electrode is lower than the electric conductivity of the first electrode.

17. The semiconductor device of claim 14, wherein the second electrode is electrically insulated from the first electrode.

18. The semiconductor device of claim 14, wherein the second electrode is electrically connected to one of the first load terminal, the first electrode, and a semiconductor region of the semiconductor body.

19. The semiconductor device of claim 14, further comprising an electrically conductive path that is coupled to the second electrode and configured to provide a signal to the second electrode.

20. The semiconductor device of claim 19, wherein the semiconductor body comprises an active region and an edge region surrounding the active region, the drift zone, the source zone and the contiguous zone are arranged in the active region, the edge region comprises a guard zone configured to extend a depletion region formed by the contiguous zone and the drift zone, and the electrically conductive path connects the guard zone to the second electrode.

21. The semiconductor device of claim 20, wherein the guard zone is doped and wherein the electrically conductive path comprises a semiconductor region doped complementary to the guard zone.

22. The semiconductor device of claim 20, wherein the guard zone and the contiguous zone are doped with dopants of the same conductivity type.

23. The semiconductor device of claim 14, wherein the bottom region of the trench and the contiguous zone overlap along the first lateral direction.

24. The semiconductor device of claim 14, wherein the contiguous zone is formed by a body zone and a shield zone, and wherein the shield zone is electrically connected to the first load terminal.

25. The semiconductor device of claim 24, wherein a dopant concentration of the shield zone is greater than a dopant concentration of the body zone, and wherein the bottom region of the trench and the shield zone overlap along the first lateral direction.

* * * * *